(12) United States Patent
Shiraishi et al.

(10) Patent No.: US 8,343,714 B2
(45) Date of Patent: Jan. 1, 2013

(54) RESIST APPLYING AND DEVELOPING METHOD, RESIST FILM PROCESSING UNIT, AND RESIST APPLYING AND DEVELOPING APPARATUS COMPRISING THE UNIT

(75) Inventors: Gousuke Shiraishi, Tokyo (JP); Yuichiro Inatomi, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 275 days.

(21) Appl. No.: 12/762,666

(22) Filed: Apr. 19, 2010

(65) Prior Publication Data

US 2010/0266969 A1 Oct. 21, 2010

(30) Foreign Application Priority Data

Apr. 17, 2009 (JP) ................................. 2009-101241

(51) Int. Cl.
*G03F 7/00* (2006.01)
*G03F 7/004* (2006.01)
*G03F 7/40* (2006.01)

(52) U.S. Cl. ..................... 430/331; 430/270.1; 430/322; 430/330; 430/944

(58) Field of Classification Search .................. 430/330, 430/331, 322, 944
See application file for complete search history.

(56) References Cited

U.S. PATENT DOCUMENTS

| | | | | |
|---|---|---|---|---|
| 4,239,816 A * | 12/1980 | Breininger et al. | ........... | 427/168 |
| 4,264,725 A * | 4/1981 | Reeves | ........................... | 430/619 |
| 4,324,717 A * | 4/1982 | Layer | ............................. | 524/244 |
| 5,554,487 A * | 9/1996 | Ivory et al. | ..................... | 430/311 |
| 5,612,303 A * | 3/1997 | Takayanagi et al. | ........... | 510/174 |
| 5,615,387 A * | 3/1997 | Crockett et al. | ................ | 29/847 |
| 5,994,597 A * | 11/1999 | Bhatt et al. | ..................... | 568/810 |
| 6,187,965 B1 * | 2/2001 | Bhatt et al. | ..................... | 568/810 |
| 6,503,693 B1 * | 1/2003 | Mohondro et al. | ........... | 430/328 |
| 6,582,891 B1 * | 6/2003 | Hallock et al. | ................ | 430/330 |
| 6,977,219 B2 * | 12/2005 | Frost et al. | ..................... | 438/637 |
| 7,129,199 B2 * | 10/2006 | Zhang et al. | ................... | 510/175 |
| 7,312,148 B2 * | 12/2007 | Ramaswamy et al. | ........ | 438/660 |
| 7,875,420 B2 * | 1/2011 | Inatomi | ......................... | 430/331 |
| 7,989,156 B2 * | 8/2011 | Inatomi | ......................... | 430/329 |
| 2005/0084807 A1 * | 4/2005 | Meagley et al. | .............. | 430/464 |

FOREIGN PATENT DOCUMENTS

| | | |
|---|---|---|
| JP | 2004-182796 A | 7/2004 |
| JP | 2005-37888 A | 2/2005 |
| JP | 2007-161987 A | 6/2007 |

\* cited by examiner

*Primary Examiner* — Amanda C. Walke
(74) *Attorney, Agent, or Firm* — Abelman, Frayne & Schwab

(57) ABSTRACT

A resist film processing unit is disclosed that can improve an etching resistance of a resist film formed on a substrate. The resist film processing unit includes a light source to irradiate an ultraviolet light on a resist film patterned by a development process, a heating part configured to heat the resist film irradiated with the ultraviolet light by the light source, and a solvent processing unit configured to expose the resist film to a solvent gas including a solvent that contains a benzene ring, during or after heating of the resist film by the heating part.

5 Claims, 9 Drawing Sheets

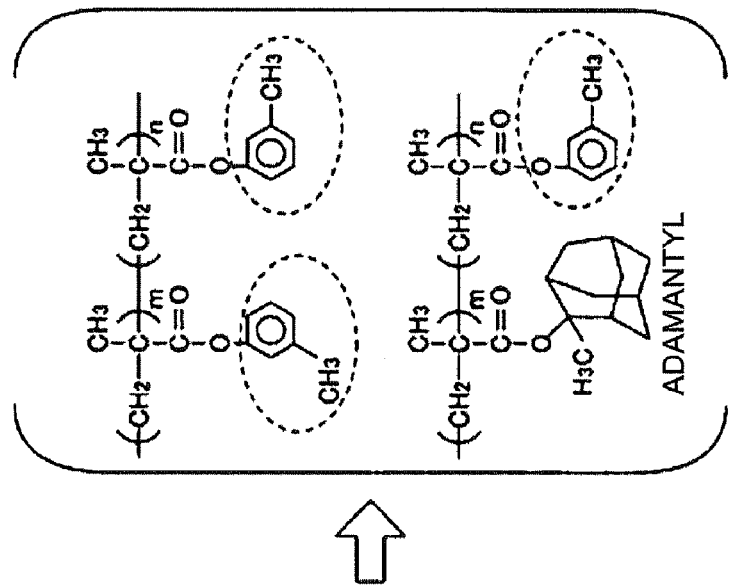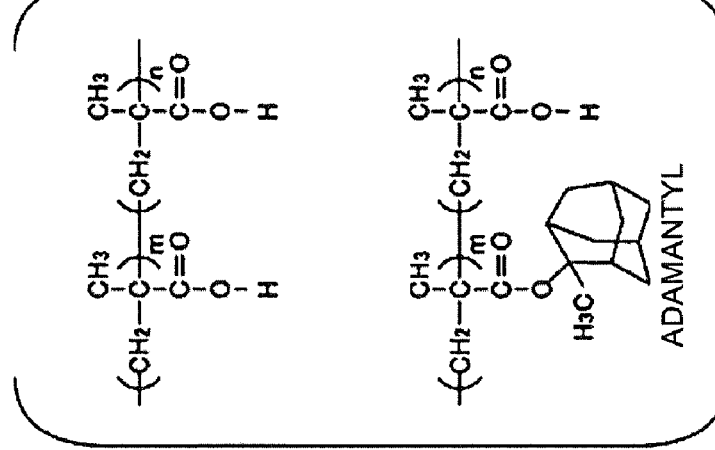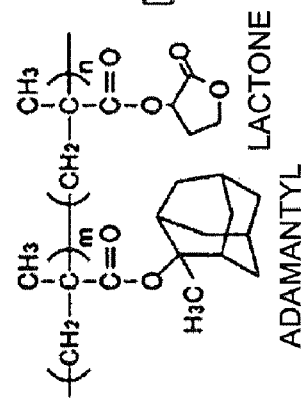

RESIST APPLYING AND DEVELOPING METHOD, RESIST FILM PROCESSING UNIT, AND RESIST APPLYING AND DEVELOPING APPARATUS COMPRISING THE UNIT

This application is based on and claims priority from Japanese Patent Application No. 2009-101241, filed on Apr. 17, 2009, with the Japanese Patent Office, the disclosure of which is incorporated herein in its entirety by reference.

TECHNICAL FIELD

The present disclosure relates to a resist applying and developing method, a resist film processing unit, and a resist applying and developing apparatus comprising the unit. More particularly, the present disclosure relates to a resist applying and developing method, a resist film processing unit, and a resist applying and developing apparatus comprising the unit, which can improve an etching resistance.

BACKGROUND

As a semiconductor integrated circuit or a flat panel display (FPD) has been more highly integrated, the wavelength of an exposure light in a photolithography process has become shorter. Thus, an ArF excimer laser beam (wavelength: 193 nm) having a wavelength shorter than an i-ray (wavelength: 356 nm) or a KrF excimer laser beam (wavelength: 248 nm) has been used. Accordingly, selected resists having a resolving power over the ArF excimer laser beam have been used. For example, see Japanese Patent Laid-open Publication Nos. 2004-182796, and 2005-037888.

A conventional KrF resist achieves an etching resistance by a benzene ring working as a terminal group (protecting group) in its chemical structure. Meanwhile, an ArF resist achieves an etching resistance by an adamantyl group instead of a benzene ring. This is because the benzene ring completely absorbs an ArF excimer laser beam (193 nm), thereby preventing a resist film from being exposed to light. See, for example, paragraph [0034] of Japanese Patent Laid-open Publication No. 2007-161987

However, there is a problem in that the etching resistance achieved by the adamantyl group is lower than that achieved by the benzene ring. For example, according to the investigation of the inventors of the present disclsoure, when etching speeds of both of ArF and KrF resist films were tested by using a mixed gas of $CF_4/O_2$ under the similar etching condition, the etching speed of the ArF resist film was about 300 nm/min, and the etching speed of the KrF resist film was about 260 nm/min. Since a higher etching rate can be achieved at a lower etching speed of a resist film, an ArF resist is required to have an increased etching resistance.

SUMMARY

According to one embodiment, there is provided a resist applying and developing method including, forming a resist film on a substrate, exposing the resist film formed on the substrate, developing the exposed resist film, thereby patterning the resist film, irradiating an ultraviolet light on the resist film patterned by a development process, heating the resist film during or after the irradiation of the ultraviolet light, and exposing the resist film to a solvent gas including a solvent that contains a benzene ring during or after the heating of the resist film.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIGS. 7(*a*), 7(*b*), 7(*c*) each shows chemical structures of an ArF resist.

DETAILED DESCRIPTION

Figure 1:
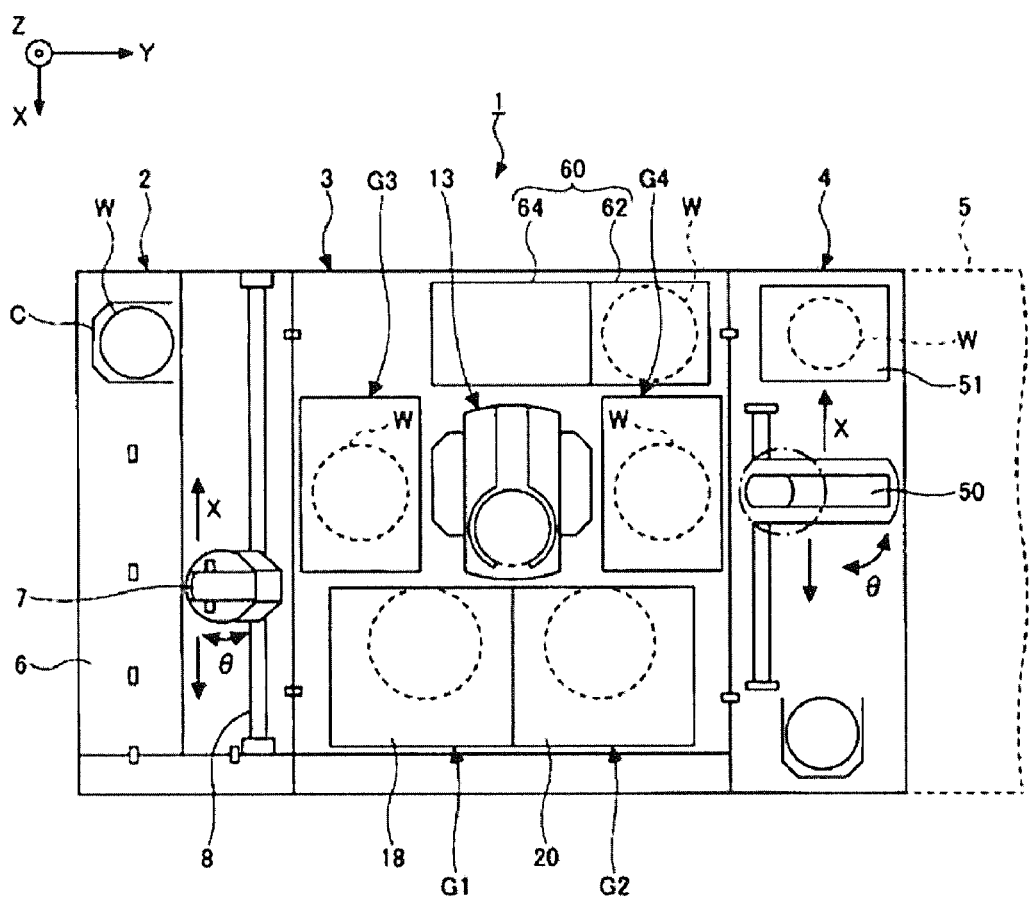
FIG. 1 is a schematic plane view illustrating the configuration of a resist applying and developing apparatus according to an exemplary embodiment of the present disclosure.

In the following detailed description, reference is made to the accompanying drawings, which form a part hereof. The illustrative embodiments described in the detailed description, drawings, and claims are not meant to be limiting. Other embodiments may be utilized, and other changes may be made, without departing from the spirit or scope of the subject matter presented here.

The present disclosure provides a resist applying and developing method, a resist film processing unit, and a resist applying and developing apparatus including the unit, which can improve the etching resistance of the resist film.

According to an aspect of the present disclosure, a resist applying and developing method includes forming a resist film on a substrate, exposing the resist film formed on the substrate, developing the exposed resist film to pattern the resist film, irradiating an ultraviolet light on the resist film, heating the resist film during or after the irradiation of the ultraviolet light, and exposing the resist film to a solvent gas including a solvent that contains a benzene ring during or after the heating of the resist film.

In the resist applying and developing method, the solvent may be a phenolic solvent selected from phenols group, and the phenolic solvent may be m-methylphenol.

Also, in the exposing of the resist film, an ArF (Argon Fluoride) light source may be used. In other words, the resist film formed in the forming of the resist film may be a so-called ArF resist film having a resolving power for an ArF excimer laser beam. Also, in the irradiating of an ultraviolet light, the ultraviolet light may include a wavelength component ranges from 150 nm to 450 nm.

According to another aspect of the present disclosure, there is provided a resist film processing unit including, a light source to irradiate an ultraviolet light on a resist film patterned by a development process, a heating part configured to heat the resist film during or after irradiation of the ultraviolet light on the resist film by the light source, and a solvent processing unit configured to expose the resist film to a solvent gas including a solvent that contains a benzene ring during or after the heating of the resist film by the heating part.

In the above described resist film processing unit, preferably, the solvent may be a phenolic solvent selected from phenols group, and the phenolic solvent may be m-methylphenol. Also, in the irradiating of an ultraviolet light, the ultraviolet light may include a wavelength component ranges from 150 nm to 450 nm.

According to yet another aspect of the present disclosure, there is provided a resist applying and developing apparatus including, a resist forming device to form a resist film on a substrate, a developing device to develop the resist film exposed to a light to pattern the resist film, and the resist film processing unit described above.

The resist applying and developing method, the resist film processing unit, and the resist applying and developing apparatus including the unit, according to embodiments of the present disclosure can improve an etching resistance of the resist film.

Hereinafter, an exemplary embodiment as a non-limiting example of the present disclosure will be described with reference to appended drawings. In all of the appended drawings, the same or corresponding members (or components) are designated with the same or corresponding reference numerals to omit repeated descriptions.

Figure 2:
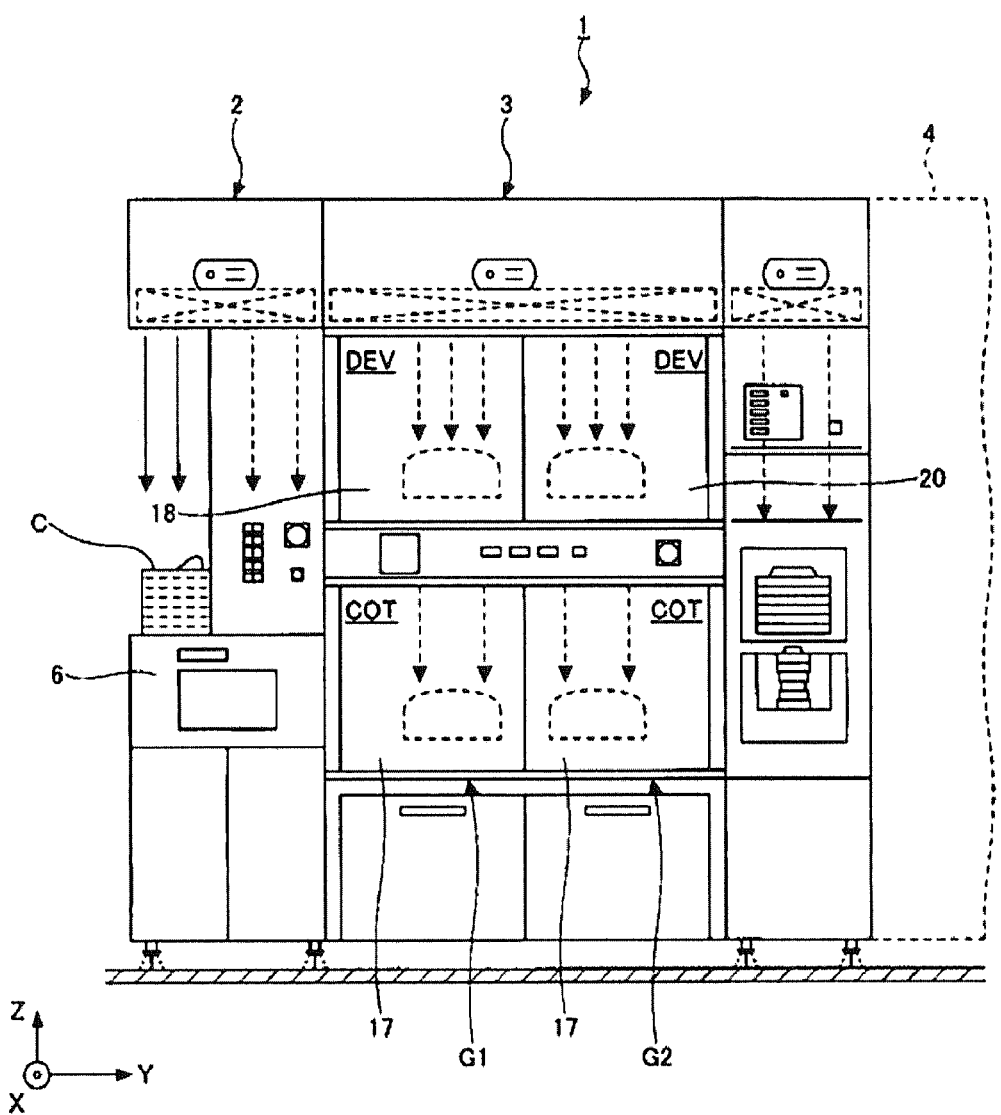
FIG. 2 is a schematic front view of the resist applying and developing apparatus shown in FIG. 1.
Figure 3:
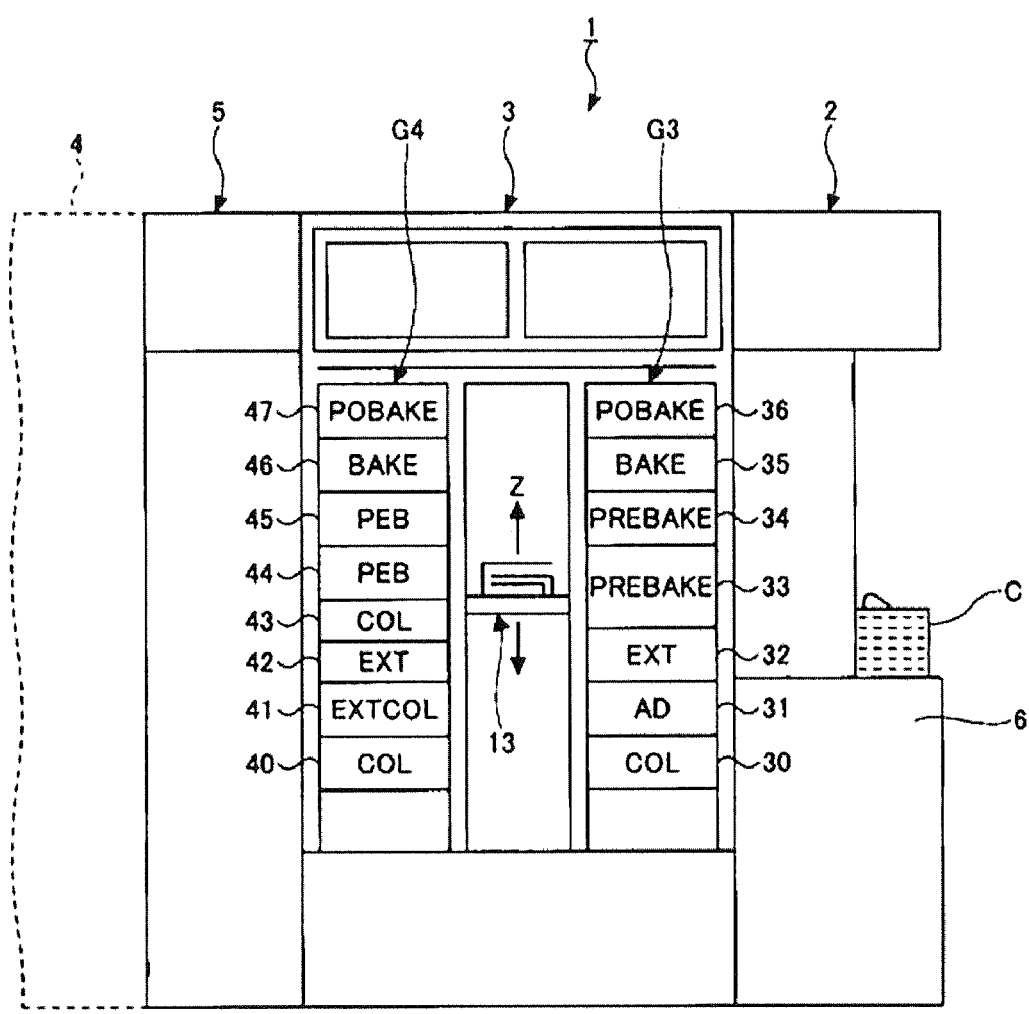
FIG. 3 is a schematic back view of the resist applying and developing apparatus shown in FIG. 1.

FIG. 1 is a schematic plane view illustrating the configuration of a resist applying and developing apparatus 1 according to one exemplary embodiment of the present disclosure, FIG. 2 is a schematic front view of resist applying and developing apparatus 1, and FIG. 3 is a schematic rear view of resist applying and developing apparatus 1.

As shown in FIG. 1, resist applying and developing apparatus 1 includes a cassette station 2, a processing station 3, and an interface device 4.

Cassette station 2 includes an arranging device 6, and a wafer carrying means 7. In arranging device 6, a cassette C receiving, for example, twenty-five (25) semiconductor wafers W (hereinafter, referred to as wafers W) is disposed. Wafer carrying means 7 takes out wafer W from cassette C disposed in arranging device 6, and loads/unloads wafer W between cassette C and processing station 3. In arranging device 6, a plurality of (for example, four (4)) cassettes C may be disposed in the X direction (the longitudinal direction of cassette station 2) in the drawing. Wafer carrying means 7 is disposed between arranging device 6 of cassette station 2 and processing station 3, and may move along a carrying path 8 in the X direction. Also, wafer carrying means 7 includes a wafer carrying arm 7a which may move in the Y direction, the Z direction (upward/downward direction), and the θ direction (the rotational direction on the Z axis). Through such a configuration, wafer carrying means 7 may sequentially take out wafers W received in a multi-stage structure in the Z direction within cassette C, by selectively accessing cassette C disposed in arranging device 6, and deliver the taken-out wafers W to a third processing device group G3 (which will be described later) of processing station 3. Also, wafer carrying means 7 may have an alignment function for aligning wafers W.

A main carrying device 13 is provided near the center of processing station 3, and four (4) processing device groups G1, G2, G3, and G4 are disposed around main carrying device 13. These processing device groups includes, as described below, various processing devices which are disposed in a multi-stage structure. First processing device group G1 and second processing device group G2 are disposed at the +X direction side with respect to main carrying device 13. Also, third processing device group G3 and fourth processing device group G4 are disposed at both sides in the Y direction of main carrying device 13. Specifically, third processing device group G3 is disposed adjacent to cassette station 2, and fourth processing device group G4 is disposed adjacent to interface device 4.

Main carrying device 13 may load and unload wafer W to/from various kinds of processing devices (which will be described later) disposed in these processing device groups G1, G2, G3, and G4, and a resist film processing unit 60 (which will be described later).

Each of first processing device group G1 and second processing device group G2 includes, for example, a resist applying device 17, and a developing device 18 as shown in FIG. 2. Resist applying device 17 applies a resist liquid on wafer W, thereby forming a resist film. Developing device 18 is disposed above resist applying device 17, and develops an exposed resist film.

Third processing device group G3 includes a cooling device 30 to cool wafer W, an adhesion device 31, an extension device 32 to transfer wafer W, a pre-baking devices 33 and 34, a reserve baking device 35, and a post-baking device 36, which are sequentially layered in order from bottom to top, as shown in FIG. 3. Adhesion device 31 performs an adhesion process on wafer W to improve a fixing property of a resist liquid. Pre-baking devices 33 and 34 perform a baking process for evaporating a solvent included in the resist liquid applied on wafer W. Post-baking device 36 performs a post-baking process for heating a developed resist film.

Fourth processing device group G4 includes a cooling device 40, an extension cooling device 41 to naturally cool wafer W, an extension device 42, a cooling device 43, post-exposure baking devices 44 and 45 to heat an exposed resist film, a reserve baking device 46, and a post-baking device 47, which are sequentially layered in order from bottom to top, as shown in FIG. 2. Extension device 42 transfers wafer W between main carrying device 13 and a wafer carrying means 50 which will be described later.

Also, the number and disposition of processing device groups, and the number, kinds, and disposition of processing devices disposed in each processing device group may be arbitrarily selected according to the processes performed in resist applying and developing apparatus 1, or the kind of a fabricated device.

Referring back to FIG. 1, wafer carrying means 50 is provided at the center of interface device 4. Wafer carrying means 50 is configured to move in the X and Z directions freely, and rotate in the θ direction. Wafer carrying means 50 may access extension cooling device 41 and extension device 42 included in fourth processing device group G4, an edge exposure device 51, and an exposure device 5. Wafer carrying means 50 carries wafer W to the respective devices.

Figure 4:
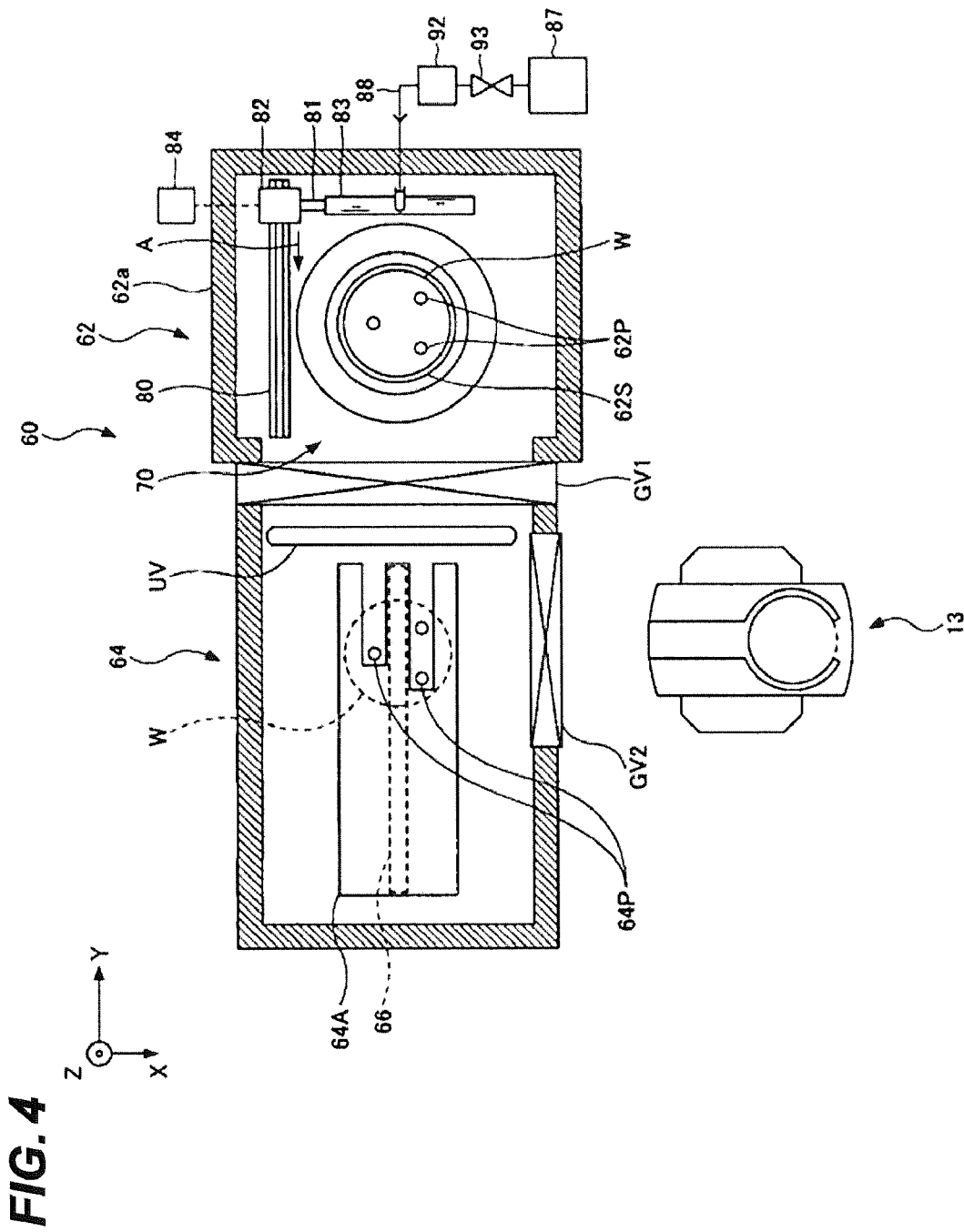
FIG. 4 is a schematic plane view illustrating a resist film processing unit provided in the resist applying and developing apparatus shown in FIG. 1, according to an exemplary embodiment of the present disclosure.

Hereinafter, resist film processing unit 60 disposed in processing station 3 will be described along with FIGS. 4 through 6. FIG. 4 is a schematic plane view illustrating resist film processing unit 60, FIG. 5 is a schematic cross-sectional view illustrating resist film processing unit 60, and FIG. 6 is a schematic configuration view illustrating the structure of a solvent supply nozzle 83 provided in resist film processing unit 60.

Referring to FIG. 4, resist film processing unit 60 includes a solvent processing chamber 62 that performs a solvent process, and a preliminary chamber 64 connected to solvent processing chamber 62 via a gate valve GV1.

Solvent processing chamber 62 includes a cup 70 provided near the center within a case 62a, a susceptor 62S as a temperature control heating plate, and solvent supply nozzle 83 that supplies a solvent gas on the surface of wafer W supported by susceptor 62S.

Figure 5:
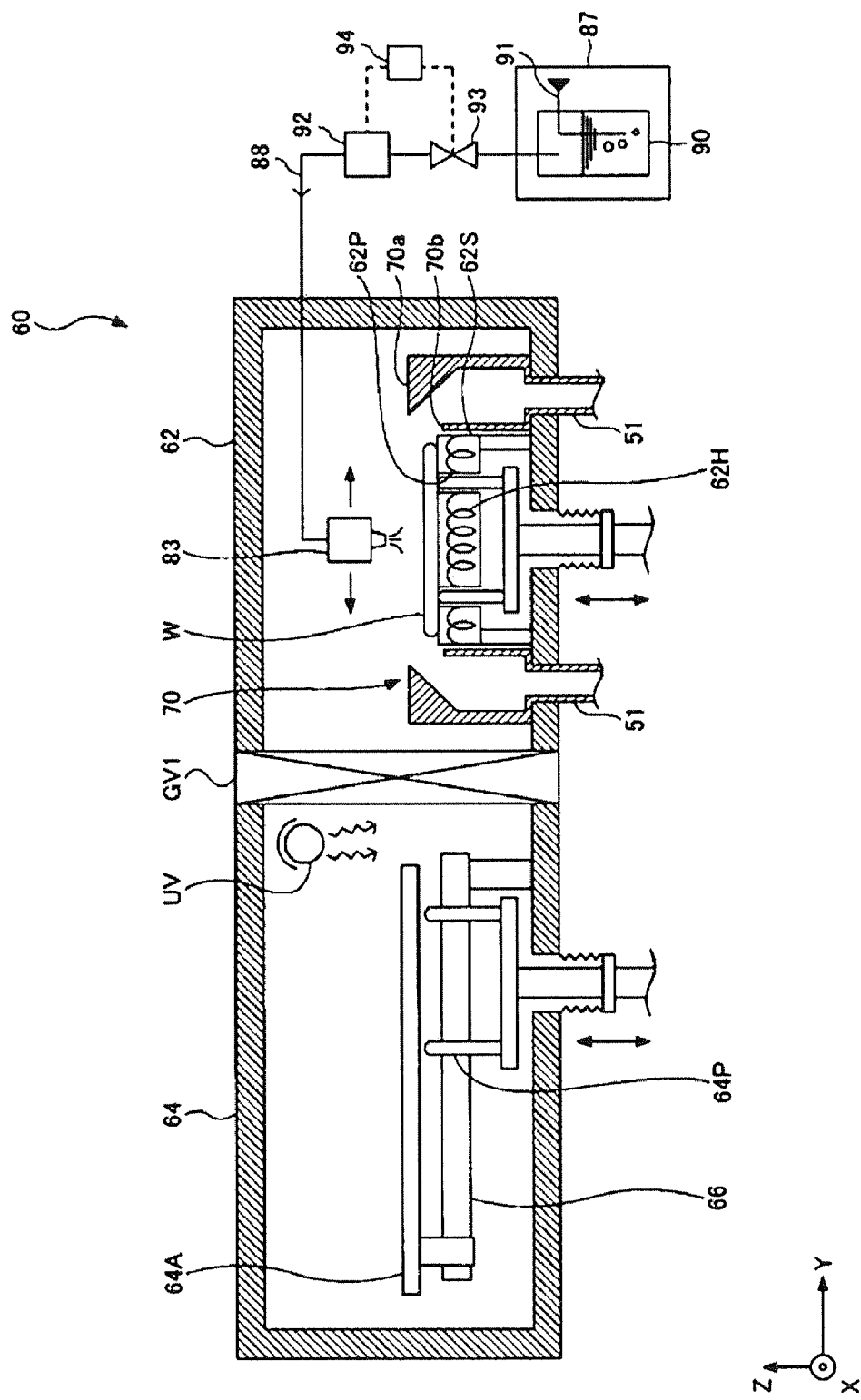
FIG. 5 is a schematic side view illustrating the resist film processing unit shown in FIG. 4.
Figure 6:
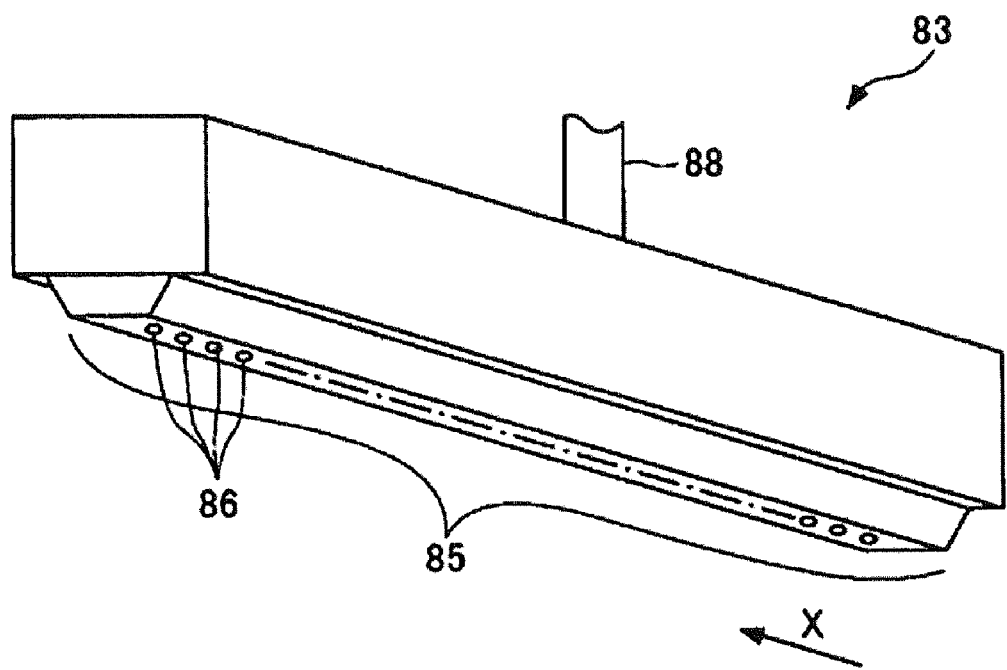
FIG. 6 is a perspective view illustrating a solvent supply nozzle provided in the resist film processing unit shown in FIG. 4.

Cup 70 includes an outer cup 70a and an inner cup 70b, which are disposed in approximately a concentric circular shape, as shown in FIG. 5. At the bottom portion of cup 70, an opening is formed that is connected to an exhaust pipe 51 which passes through the bottom portion of solvent processing chamber 62. Exhaust pipe 51 is connected to an exhaust system (not shown). The exhaust system passes an air flow through the gap between outer cup 70a and inner cup 70b from the gap between outer cup 70a and susceptor 62S, and the air flow is exhausted from exhaust pipe 51. Accordingly, the solvent gas as described hereinafter is exhausted from solvent processing chamber 62.

Susceptor 62S is supported substantially horizontally, and has an upper surface having a similar diameter to that of wafer W. Wafer W is disposed on the upper surface of susceptor 62S. Susceptor 62S has three through holes formed therein, and three lift pins 62P capable of moving up and down direction through the through holes, thereby raising wafer W disposed on susceptor 62S. Also, a heating part 62H (FIG. 5), formed by heating material such as a heating wire, is embedded within susceptor 62S. Heating part 62H is connected to a power supply, a temperature measuring part, and a temperature controller (not shown), which in combination may heat wafer W disposed on susceptor 62S at a predetermined temperature. Also, susceptor 62S has an electrostatic chuck which may support wafer W on susceptor 62S.

Referring back to FIG. 4, a rail 80 extending in the Y direction is provided at the −X direction side of cup 70 within solvent processing chamber 62. One end of rail 80 is positioned at the −Y direction side of cup 70, and the other end of rail 80 is positioned at the +Y direction side of cup 70. A driving unit 82, attached with an arm 81, including, for example, a linear motor, is reciprocatably disposed on rail 80. At the leading end of arm 81, solvent supply nozzle 83 is attached as a nozzle for discharging a solvent gas to wafer. Through such a configuration, solvent supply nozzle 83 may be driven by driving unit 82, thereby moving above susceptor 62S. Also, the movement of solvent supply nozzle 83 is controlled, for example, by a driving controller 84 controlling the operation of driving unit 82, and driving controller 84 may move solvent supply nozzle 83 in the Y direction at a predetermined speed. Also, driving unit 82 may include a cylinder, which raises and lowers arm 81, and adjust the height of solvent supply nozzle 83.

Solvent supply nozzle 83 has a thin and long shape in the X direction. One end of solvent supply nozzle 83 (a portion to be attached to arm 81) is positioned at the −X direction side of susceptor 62S, and the other end is positioned at +X direction side of susceptor 62S. Also, a discharge part 85 is formed from one end to the other end in the longitudinal direction at the under surface of solvent supply nozzle 83, as shown in FIG. 6. A plurality of discharge holes 86 opening toward the bottom of discharge part 85 are formed in the longitudinal direction of solvent supply nozzle 83. Discharge holes 86 are communicated with a conduit within solvent supply nozzle 83, and the conduit is communicated with a solvent supply tube 88 connected to the upper position of solvent supply nozzle 83. Solvent supply tube 88, is connected to a solvent gas supply source 87, as shown in FIG. 4. Through such a configuration, solvent supply nozzle 83 may introduce a solvent gas, supplied from solvent gas supply source 87, via solvent supply tube 88, and the introduced solvent gas may be discharged uniformly and downwardly from discharge holes 86 at the bottom surface.

As specifically shown in FIG. 5, solvent gas supply source 87 includes a reservoir tank 90 and a carrier gas supply tube 91. Reservoir tank 90 is connected to, for example, solvent supply tube 88, and contains a liquid solvent. Carrier gas supply tube 91 supplies a carrier gas into reservoir tank 90. By the supply (bubbling) of a carrier gas from carrier gas supply tube 91 into the liquid solvent of reservoir tank 90, a carrier gas containing solvent vapor (hereinafter, referred to as a solvent gas) may be sent to solvent supply tube 88. Accordingly, the solvent gas is supplied to solvent supply nozzle 83 via solvent supply tube 88. A solvent containing a benzene ring may be used as the first solvent contained at reservoir tank 90. Specifically, the solvent may be selected from phenols group. More specifically, the solvent may be selected from the group including phenol, o-methylphenol, m-methylphenol (m-cresol), p-methylphenol, 1-naphthol, 2-naphthol, 1,2-dihydroxybenzene, 1,3-dihydroxybenzene, 1,4-dihydroxybenzene, 1,2,3-trihydroxybenzene, o-ethylphenol, m-ethylphenol, p-ethylphenol, 2,3-dimethylphenol, 2,4-dimethylphenol, 2,5-dimethylphenol, 2,6-dimethylphenol, 2,3,4-trimethylphenol, 2,3,5-trimethylphenol, 2,3,6-trimethylphenol, 2,4,6-trimethylphenol, 2,4,5-trimethylphenol, o-nitrophenol, m-nitrophenol, p-nitrophenol, o-bromophenol, m-bromophenol, p-bromophenol, p-fluorophenol, p-chlorophenol, p-iodophenol, p-aminophenol, anisole, and a mixture of any of these solvent. Also, an inert gas, such as helium (He) or argon (Ar), or nitrogen gas may be used as a carrier gas mentioned above.

Also, solvent supply tube 88 is provided with a flow sensor 92 for detecting the flow of a solvent gas, and a valve 93 for controlling the flow of the solvent gas. The result detected by flow sensor 92 is output to a flow controller 94 as shown in FIG. 5, and flow controller 94 may adjust the extent of opening/closing of valve 93 based on the detected result, thereby adjusting the flow of the solvent gas supplied to solvent supply nozzle 83.

In preliminary chamber 64, a carrying arm 64A for supportedly carrying wafer W is provided. Carrying arm 64A is movably supported by a guide rail 66 as shown in FIG. 5, and may reciprocate along guide rail 66 in the Y direction of the drawing by a driving part (not shown). Also, carrying arm 64A has two slits through which three lift pins 64P may move up and down. Through the upward/downward movement of lift pins 64P, wafer W, disposed on carrying arm 64A, may be raised from carrying arm 64A. In the present exemplary embodiment, a conduit through which a fluid passes may be formed within carrying arm 64A, thereby circulating a temperature-controlled fluid controlled from a fluid circulator (not shown). Accordingly, wafer W disposed on carrying arm 64A may be cooled. Also, as described above, since carrying arm 64A may contact with wafer W in a wide range, except for the slits for allowing lift pins 64P to move up and down, it is possible to efficiently cool wafer W.

Also, preliminary chamber 64 has a gate valve GV2 which faces main carrying device 13 of processing station 3. When gate valve GV2 is opened, wafer W may be loaded/unloaded into/from preliminary chamber 64 by main carrying device 13. When gate valve GV2 is closed, preliminary chamber 64 may be airtightly maintained.

Also, referring to FIGS. 4 and 5, an ultraviolet lamp UV extending along with gate valve GV1 is provided near the ceiling of preliminary chamber 64. Ultraviolet lamp UV preferably generates ultraviolet light including a wavelength component ranges from 150 nm to 450 nm. This is because when light having a wavelength shorter than about 150 nm is irradiated on a resist film, the structure of the resist may be destroyed, and when light having a wavelength longer than about 450 nm is irradiated on a resist film, the effects as described below cannot be achieved due to the low energy. Specifically, ultraviolet lamp UV may be a single wavelength light source, such as a xenon (Xe) excimer lamp generating ultraviolet light of 172 nm or an argon fluoride (ArF) excimer lamp generating ultraviolet light of 193 nm. Alternatively, ultraviolet lamp UV may include a xenon.mercury lamp, a high pressure mercury lamp, a low pressure mercury lamp, or a metal halide lamp, together with a predetermined filter. With these set up, ultraviolet lamp UV may generate light having a wide emission spectrum. However, it may be enough as long as a part of the emission spectrum is within a range of about 150 nm to 450 nm. Ultraviolet lamp UV disposed as shown may irradiate ultraviolet light on wafer W while wafer W is loaded into solvent processing chamber 62 by carrying arm 64A from preliminary chamber 64. Also, ultraviolet lamp UV may be provided in such a manner that it extends along gate valve GV2 near the ceiling portion of preliminary chamber 64. Accordingly, ultraviolet light may be irradiated on wafer W when wafer W is loaded into preliminary chamber 64 by main carrying device 13. Also, one or more xenon excimer lamps may be disposed above carrying arm 64A as long as it can irradiate an ultraviolet light on wafer W. Especially, an ultraviolet light may be irradiated onto the entire area of wafer W when a plurality of xenon excimer lamps are disposed. Also, it is possible to allow ultraviolet lamp UV to move in the Y direction within preliminary chamber 64. Through the movement, ultraviolet lamp UV can irradiate ultraviolet light on wafer W on carrying arm 64A.

Hereinafter, the operation of resist applying and developing apparatus 1 provided with resist film processing unit 60 according to the present exemplary embodiment (a resist applying and developing method) will be described.

Initially, at least one wafer W to be processed is taken out from cassette C (FIG. 1) and is carried to extension device 32 (FIG. 3) of third processing device group G3 by wafer carrying means 7. Then, wafer W is loaded in adhesion device 31 of third processing device group G3 by main carrying device 13, and then, in order to improve the adhesion of a resist liquid on wafer W, wafer W is applied with an adhesion enhancer such as, for example, HMDS. Next, wafer W is carried to cooling device 30, and is cooled at a predetermined temperature. Wafer W is then carried to resist applying device 17, where a resist liquid for ArF is rotatingly applied on wafer W, thereby forming a resist film for ArF.

Wafer W on which an ArF resist film is formed is carried from resist applying device 17 to pre-baking device 33 by main carrying device 13, and is subjected to a pre-baking process. Then, wafer W is carried to extension cooling device 41 by main carrying device 13 and is cooled. Also, wafer W is sequentially carried to edge exposure device 51 and exposure device 5 by wafer carrying means 50, and is subjected to a predetermined process in each of the devices. For example, the ArF resist film formed on wafer W is exposed to a light generated by ArF excimer laser through a predetermined photomask (reticle), and then, wafer W is carried to extension device 42 of fourth processing device group G4 by wafer carrying means 50.

Then, wafer W is carried to post-exposure baking device 44 by main carrying device 13, and is subjected to a post-exposure baking. Then, wafer W is carried to cooling device 43 and is cooled. Next, wafer W is carried to developing device 18 of first processing device group G1 or second processing device group G2 by main carrying device 13, and herein, a developing process on wafer W is performed. As a result, a patterned resist film (resist mask) is formed on wafer W.

After the developing process is completed, wafer W is carried to resist film processing unit 60 (FIGS. 4 and 5) by main carrying device 13. Specifically, wafer W is loaded into preliminary chamber 64 by main carrying device 13 when gate valve GV2 (FIG. 4) is opened, and is supported by carrying arm 64A and lift pins 64P. Next, lift pins 64P are moved up, thereby taking out wafer W from main carrying device 13, and main carrying device 13 is retreated from preliminary chamber 64. Then, lift pins 64P are moved down, thereby disposing wafer W on carrying arm 64A. After gate valve GV2 is closed, wafer W is carried from preliminary chamber 64 to solvent processing chamber 62. Specifically, gate valve GV1 between preliminary chamber 64 and solvent processing chamber 62 is opened after ultraviolet lamp UV provided in preliminary chamber 64 is turned on. Then, carrying arm 64A is moved along guide rail 66, thereby loading wafer W into solvent processing chamber 62, and wafer W is supported by susceptor 62S.

As described above, since wafer W carried into solvent processing chamber 62 from preliminary chamber 64 is irradiated with ultraviolet light (for example, 172 nm or 193 nm) from ultraviolet lamp UV, the patterned ArF resist film on wafer W is chemically activated. Specifically, as shown in FIGS. 7(a) and 7(b), an adamantyl group and/or a lactone group working as a terminal group within the patterned ArF resist film on wafer W are/is decomposed by the ultraviolet light, and the resist is terminated by hydrogen (H) atom.

Then, lift pins 62P of solvent processing chamber 62 are moved up, thereby taking out wafer W from carrying arm 64A, and carrying arm 64A is retreated from solvent processing chamber 62. Next, lift pins 62P are moved down, thereby disposing wafer W on susceptor 62S. Then, gate valve GV1 is closed.

Next, by heating part 62H embedded in susceptor 62S, wafer W is heated at a temperature range of about 40° C. to 100° C. In an embodiment, wafer W may be heated at about 70° C., for about 60 seconds. This facilitates the decomposition and acidification of the above mentioned adamantyl group (or the lactone group). Also, herein, the inside of cup 70 is exhausted by the exhaust system, thereby purging inside of solvent processing chamber 62.

Next, solvent supply nozzle 83 starts to move in the −Y direction as indicated by the arrow A as shown in FIG. 4. When solvent supply nozzle 83 reaches above one end of a wafer supporting portion from the outside of cup 70, the exhaust of cup 70 is stopped, and a solvent gas starts to be discharged at a predetermined flow from solvent supply nozzle 83 through discharge holes 86. Then, solvent supply nozzle 83 discharges the solvent gas while moving in the other end side of wafer W (in the −Y direction) at a fixed speed. Thus, the patterned resist film on wafer W is exposed to the solvent gas. Next, when solvent supply nozzle 83 moves to a position above the end portion of the −Y direction side of wafer supporting portion, solvent supply nozzle 83 turns back and moves from the other end of wafer W to one end (in +Y direction). In this manner, solvent supply nozzle 83 reciprocates above wafer W, thereby supplying the solvent gas to the surface of the resist film on wafer W. The supply time of the solvent gas may be, for example, about 40 seconds.

When the resist film is exposed to the solvent gas, solvent molecules within the solvent gas are introduced into the resist film, and a benzene ring from the solvent molecules is admitted to a terminal group of the resist film. In other words, the benzene ring is introduced into the resist film, thereby improving the etching resistance of the resist film. Also, the movement rate of solvent supply nozzle 83, and the supply amount of the solvent gas may be determined in advance by a preliminary test.

After the reciprocation of solvent supply nozzle 83 is completed, the supply of the solvent gas is stopped, and the exhaust of cup 70 is resumed.

Then, wafer W is unloaded from solvent processing chamber 62 to preliminary chamber 64 by carrying arm 64A, and is carried to post-baking device 47 of fourth processing device group G4 by main carrying device 13. Wafer W is then subjected to a post-baking process. Next, wafer W is carried to cooling device 30 of third processing device group G3 by main carrying device 13, and is cooled. Then, after wafer W is returned to its original cassette C by extension device 32, a series of treatment processes on wafer W, including resist application/exposure/development, are completed.

As described above, in the resist applying and developing method according to the exemplary embodiment of the present disclosure, the patterned ArF resist film is irradiated with the ultraviolet light and heated, and is then supplied with the solvent gas containing phenols. Thus, the adamantyl group and/or the lactone group working as a terminal group within the ArF resist film may be substituted by a benzene ring included in the solvent gas. Accordingly, the etching resistance of the ArF resist film may be improved.

Also, in resist applying and developing apparatus according to the exemplary embodiment of the present disclosure, the ultraviolet light from ultraviolet lamp UV provided in preliminary chamber 64 may be irradiated on wafer W having the patterned ArF resist film. Wafer W may then be heated by heating part 62H embedded within susceptor 62S within solvent processing chamber 62, and solvent supply nozzle 83 may supply the solvent gas containing phenols to wafer W. Accordingly, it is possible to appropriately execute the resist applying and developing method according to the exemplary embodiment of the present disclosure, thereby improving the etching resistance of the ArF resist film.

Figure 8A:
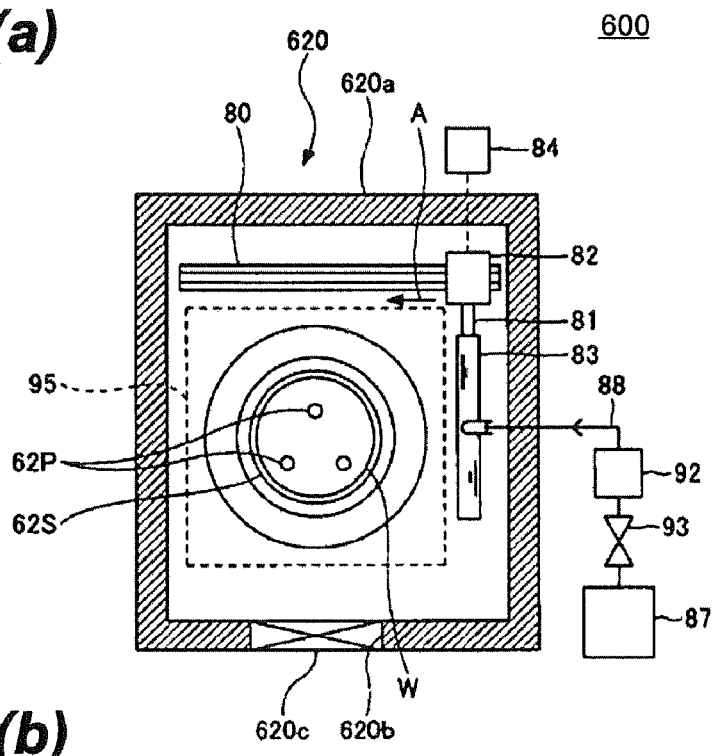
FIGS. 8(*a*), 8(*b*) each shows schematic views illustrating a resist film processing unit according to a modified embodiment of the present disclosure.

Next, hereinafter, a modified embodiment of resist film processing unit 60 provided in resist applying and developing apparatus according to the exemplary embodiment of the present disclosure will be described with reference to FIGS. 8(a) and 8(b) each shows a schematic top plan view (FIG. 8(a)) and a schematic side view (FIG. 8(b)) of a resist film processing unit 600 according to the modified embodiment.

As shown, resist film processing unit 600 of the modified embodiment has a solvent processing chamber 620 corresponding to solvent processing chamber 62, but does not have a corresponding part to preliminary chamber 64 of the above described resist film processing unit 60. An ultraviolet irradiation unit 95 is provided in solvent processing chamber 620. Also, an opening 620b is formed in solvent processing chamber 620, through which wafer W is loaded/unloaded into/from solvent processing chamber 620 by main carrying device 13. Also, opening 620b is provided with an open/close door 620c that can be opened/closed. Except for the above mentioned components, resist film processing unit 600 according to the modified embodiment has similar configuration to the above described resist film processing unit 60.

Figure 8B:
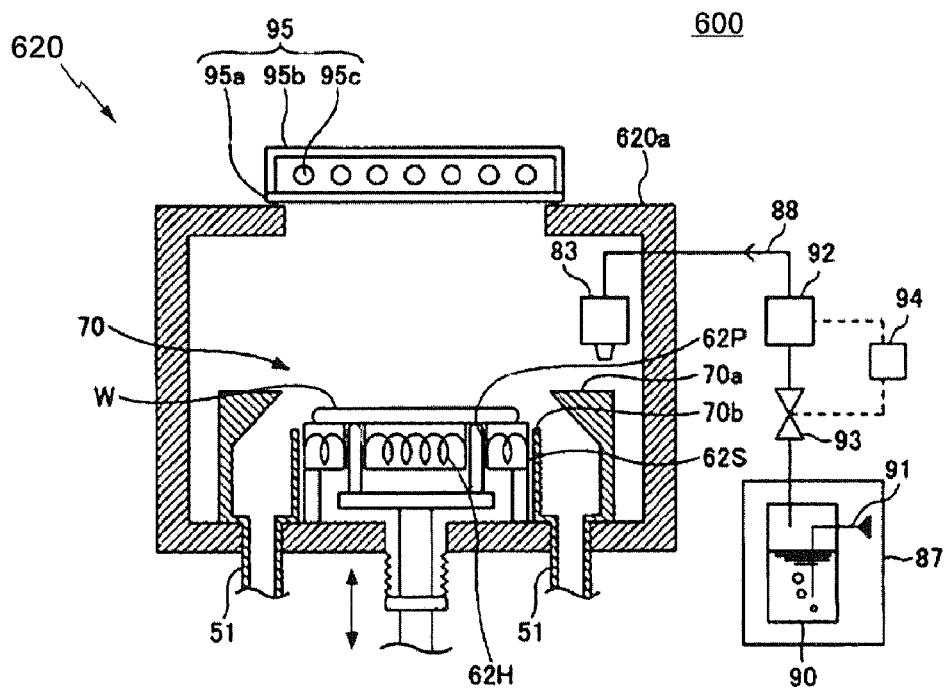

Referring to FIG. 8(b), ultraviolet irradiation unit 95 includes a window 95a, a plurality of ultraviolet lamps 95b disposed above window 95a, and a casing 95c covering window 95a and ultraviolet lamps 95b. Window 95a is formed airtightly by a sealing member at the opening formed above susceptor 62S in a case 620a of solvent processing chamber 620. Window 95a may be made of a transparent material, such as quartz, capable of transmitting ultraviolet light emitted from ultraviolet lamps 95b. Ultraviolet lamp 95b may be a xenon (Xe) excimer lamp generating an ultraviolet light of 172 nm wavelength or an argon fluoride (ArF) excimer lamp generating an ultraviolet light of 193 nm wavelength. The inner surface of casing 95c may be provided with a reflector (not shown) which reflects the ultraviolet light from ultraviolet lamps 95b, and irradiates it on wafer W. Also, a nitrogen gas supply system may be provided to purge the inside of casing 95c by nitrogen gas.

In resist applying and developing apparatus including resist film processing unit 600 having solvent processing chamber 620 as described above, wafer W having an exposed/developed/patterned ArF resist film is carried into solvent processing chamber 620 by main carrying device 13 and is disposed on susceptor 62S. Then, the ultraviolet light is irradiated from ultraviolet irradiation unit 95 on wafer W disposed on susceptor 62S for a predetermined time. Next, wafer W is heated by heating part 62H built within susceptor 62S at a temperature range of about 40° C. to 100° C. In an embodiment, wafer W may be heated at about 70° C., for about 60 seconds. Then, solvent supply nozzle 83 reciprocates in the Y direction, while supplying a solvent gas to the ArF resist film on wafer W. Thus, the resist film is exposed to the solvent gas. Then, wafer W is unloaded from solvent processing chamber 620, carried to post-baking device 47 of fourth processing device group G4, and subjected to a post-baking process. Then, wafer W is carried to cooling device 30 (FIG. 3) of third processing device group G3 by main carrying device 13, and cooled. Next, wafer W is returned to its original cassette C (FIG. 1) by extension device 32.

As described above, in resist film processing unit 600 having solvent processing chamber 620 according to the modified embodiment, the ultraviolet light from ultraviolet irradiation unit 95 provided in solvent processing chamber 620 may be irradiated on wafer W having the patterned ArF resist film. Wafer W may then be heated by heating part 62H embedded within susceptor 62S within solvent processing chamber 620, and solvent supply nozzle 83 may supply the solvent gas containing phenols to wafer W. Accordingly, the etching resistance of the ArF resist film may be improved.

Also, in solvent processing chamber 620 according to the modified embodiment, ultraviolet irradiation unit 95 may irradiate the ultraviolet light on wafer W while heating wafer W. Accordingly, the decomposition of the adamantyl group and/or the lactone group by the ultraviolet light is facilitated by the heat, thereby increasing the number of benzene rings substituting for the adamantyl group and/or the lactone group. Furthermore, the irradiation of the ultraviolet light on wafer W, the heating of wafer W, and the supply of the solvent gas to wafer W may be performed simultaneously. Also, it is possible to initiate the heating of wafer W and/or the supply of the solvent gas prior to the irradiation of the ultraviolet light on wafer W. Also, if the ultraviolet light can be irradiated on the resist film in a state where the solvent gas (solvent molecules) is adsorbed on the ArF resist film by vapor pressure of the solvent, the solvent gas may be supplied first, and the ultraviolet light may be irradiated on wafer W after the supply of the solvent gas is stopped.

EXAMPLES

Hereinafter, a test on the effects of the above described resist applying and developing method and the result will be described.

First, an ArF resist film (thickness: about 300 nm) was formed on a wafer by resist applying and developing apparatus 1, the ArF resist film was exposed by irradiation of an ArF excimer laser through a photomask with a predetermined pattern, and the resist film was developed to obtain a patterned resist film.

Next, the wafer was carried to solvent processing chamber 620, as shown in FIG. 8(b), disposed in processing station 3 of resist applying and developing apparatus 1, and was disposed on susceptor 62S. Then, a short wavelength ultraviolet light having a wavelength of 172 nm was irradiated from ultraviolet irradiation unit 95 on the wafer having the patterned resist film. Herein, the intensity of the ultraviolet light was about 36 mW/cm$^2$, and the irradiation time was about 5 seconds.

After the irradiation of the ultraviolet light, the wafer was heated by increasing the temperature of the wafer by heating part 62H built within susceptor 62S up to 70° C., and maintaining the increased temperature for about 60 seconds. Then, m-methylphenol (m-cresol) contained in reservoir tank 90, as shown in FIG. 8(b), was subjected to a bubbling process by the nitrogen gas, and the solvent gas containing m-cresol was sprayed on the wafer from solvent supply nozzle 83, thereby exposing the patterned resist film to the solvent gas. The spray time of the solvent gas which is the reciprocation time of solvent supply nozzle 83, was about 40 seconds. Also, the supply amount of the nitrogen gas was 4500 sccm, and the temperature of m-cresol within reservoir tank 90 was about 23° C.

Then, the temperature of the wafer was heated again by heating part 62H up to about 60° C., and then maintained for about 60 seconds. Although the heating is not a required step, but it can evaporate m-cresol adsorbed on the wafer with the patterned resist film, thereby removing the odor of cresol.

Next, the wafer was taken out from resist applying and developing apparatus 1 through a predetermined path, and a test by a FT-IR (ATR) method was carried out.

Figure 9A:
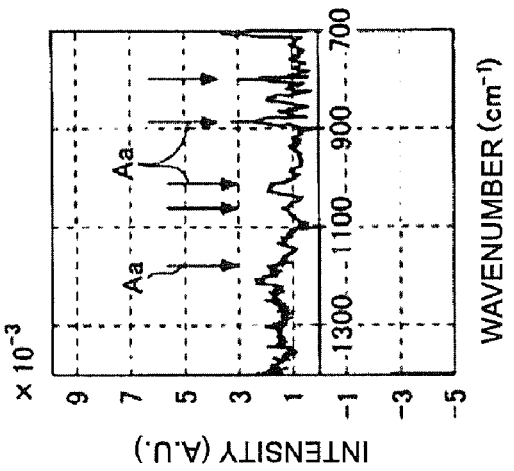
FIGS. 9(*a*), 9(*b*), 9(*c*) each shows graphs illustrating the test results on a resist applying and developing method according to an exemplary embodiment of the present disclosure.
Figure 9B:
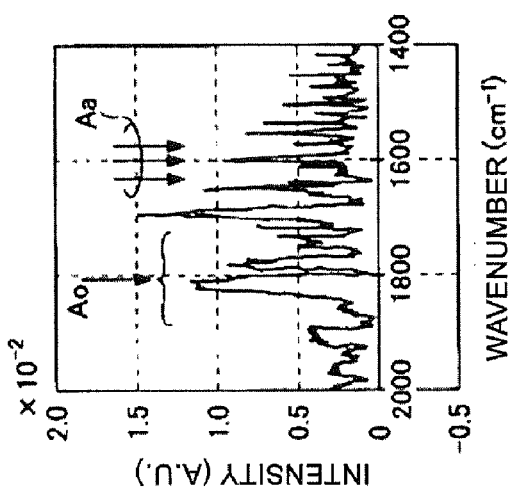
Figure 9C:
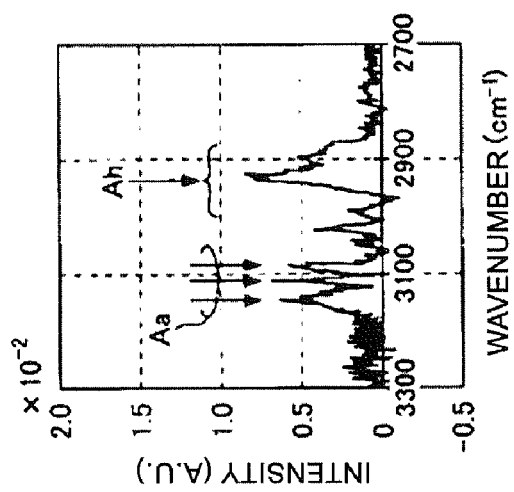

FIGS. 9(a), 9(b), 9(c) each shows a graph showing the measurement result of FT-IR on the wafer. In these graphs, the peak indicated by the arrow Aa was caused by a stretching vibration of aromatic hydrocarbon in the resist film, indicating that the benzene ring was introduced into the resist film. Also, the peak indicated by the arrow Ah in FIG. 9(a) was caused by a stretching vibration of a carbon-hydrogen bond, and the peak indicated by the arrow Ao in FIG. 9(b) was caused by a carbon-oxygen double bond.

Meanwhile, a comparison wafer was prepared separately from the test wafer. The comparison wafer was subjected to formation of an ArF resist film thereon, exposure and development, under the similar conditions to the conditions used for the above described test wafer. However, the comparison wafer was not subjected to a resist film processing. Then, an etching test was performed. Specifically, on the test wafer for the FT-IR measurement, and the comparison wafer, the resist films on the test wafer and the comparison wafer were etched by using a mixed gas of $CF_4/O_2$ under similar etching condition, and the etching rate was calculated from the etching time and the film thickness difference measured before and after the etching. As a result, compared to the etching rate (about 278.0 nm/min) of the resist film on the comparison wafer, the etching rate of the resist film on the test wafer which had been subjected to the above described resist film processing with the solvent gas was 276.3 nm/min, which is lower than the comparison wafer. Accordingly, it can be understood that the etching resistance can be improved through the resist film processing with the solvent gas as described above.

Herein, the present disclosure has been described with reference to the exemplary embodiment and the modified embodiment. However, the present disclosure is not limited thereto, and can be modified in various ways in view of the scope of the claims.

For example, resist applying and developing apparatus 1 according to the exemplary embodiment of the present disclosure may include, instead of resist film processing unit 60 or resist film processing unit 600 having solvent processing chamber 620 as in the modified embodiment, a hot-wall type oven capable of receiving and heating wafer W. The hot-wall type oven may be configured to be supplied with the solvent gas. In such a resist applying and developing apparatus, after the patterned ArF resist film is irradiated with ultraviolet light, wafer W may be loaded into the oven. Wafer W then may be heated. Herein, the heating effect may be improved since the solvent gas is heated and thus the solvent gas does not cool wafer W. Also, the oven may be configured to be pressurized up to a pressure higher than the atmospheric pressure. When the inside of the oven is pressurized by the solvent gas during the heating of wafer W, it is possible to further increase the number of benzene rings substituting for the adamantyl group and/or the lactone group.

Also, a vacuum chamber may be provided, and a solvent may be sprayed on wafer W after wafer W is introduced into the vacuum chamber by introducing the solvent into a decompressed atmosphere through a nozzle inserted in the vacuum chamber, or a micro opening formed in the vacuum chamber. Also, for example, an ultrasonic atomizer may be used to spray the solvent on wafer W under an atmospheric pressure.

Also, the resist applying and developing method and the resist applying and developing apparatus, according to the exemplary embodiment of the present disclosure, may be applied to various kinds of resists, such as a resist for i-ray or a resist for KrF, as well as the ArF resist. This is because a lactone group may be substituted by a benzene ring in resists other than the ArF resist, thereby increasing the number of benzene rings and improving the etching resistance.

Also, in the above description, the cited temperatures, times, and are illustrative only, and the optimum temperature and the optimum time may be determined through a test.

Also, in the above description, resist film processing unit 60 or resist film processing unit 600 having solvent processing chamber 620 as in the modified embodiment, is disposed in processing station 3 of resist applying and developing apparatus 1. However, these units may be disposed in interface device 4, or may be independently provided to the outside of resist applying and developing apparatus 1, so as to transfer wafer W to/from resist applying and developing apparatus 1 by a predetermined carrying means.

Also, the substrate on which a resist film is formed is not limited to a semiconductor wafer, and may be a substrate for a flat panel display (FPD). Accordingly, the resist applying and developing method and the resist applying and developing apparatus, according to the exemplary embodiment of the present disclosure, may be used in a fabrication process for FPD.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A resist applying and developing method comprising:

forming a resist film on a substrate;

exposing the resist film formed on the substrate to a light generated by an ArF excimer laser using a reticle;

developing the exposed resist film, thereby patterning the resist film on the substrate;

decomposing an adamantly group and/or a lactone group serving as a protection group in the resist film by irradiating an ultraviolet light on the resist film patterned by the developing;

heating the resist film, during or after the irradiation of the ultraviolet light, thereby facilitating decomposition of the adamantly group and/or the lactone group; and introducing a benzene ring to the protection group in the resist film by exposing the resist film to a solvent gas that contains the benzene ring, during or after the heating of the resist film.

2. The resist applying and developing method according to claim 1, wherein the solvent is a phenolic solvent selected from a phenol group.

3. The resist applying and developing method according to claim 2, wherein the phenolic solvent is m-methylphenol.

4. The resist applying and developing method according to claim 1, wherein an ArF (Argon Fluoride) light source is used in the exposing of the resist film.

5. The resist applying and developing method according to claim 1, wherein the wavelength of the ultraviolet light ranges from 150 nm to 450 nm.

* * * * *